United States Patent
Karmous et al.

(10) Patent No.: US 12,302,594 B2
(45) Date of Patent: May 13, 2025

(54) POWER SEMICONDUCTOR DEVICE AND METHOD OF PRODUCING A POWER SEMICONDUCTOR DEVICE

(71) Applicant: Infineon Technologies AG, Neubiberg (DE)

(72) Inventors: Alim Karmous, Dresden (DE); Thorsten Arnold, Jesenwang (DE)

(73) Assignee: Infineon Technologies AG, Neubiberg (DE)

(*) Notice: Subject to any disclaimer, the term of this patent is extended or adjusted under 35 U.S.C. 154(b) by 420 days.

(21) Appl. No.: 17/954,830

(22) Filed: Sep. 28, 2022

(65) Prior Publication Data
US 2023/0100846 A1    Mar. 30, 2023

(51) Int. Cl.
| H10D 12/00 | (2025.01) |
| H10D 30/01 | (2025.01) |
| H10D 62/10 | (2025.01) |
| H10D 64/27 | (2025.01) |

(52) U.S. Cl.
CPC ....... H10D 12/481 (2025.01); H10D 30/0297 (2025.01); H10D 62/106 (2025.01); H10D 62/127 (2025.01); H10D 64/513 (2025.01)

(58) Field of Classification Search
None
See application file for complete search history.

(56) References Cited

U.S. PATENT DOCUMENTS

| 2006/0209887 A1* | 9/2006 | Bhalla | H01L 29/7806 |
| | | | 257/E29.066 |
| 2008/0265315 A1* | 10/2008 | Mauder | H01L 29/1095 |
| | | | 257/E29.066 |
| 2012/0080748 A1* | 4/2012 | Hsieh | H10D 30/665 |
| | | | 257/E21.409 |
| 2014/0319605 A1* | 10/2014 | Yilmaz | H10D 62/154 |
| | | | 257/330 |
| 2015/0162410 A1* | 6/2015 | Padmanabhan | H01L 29/0623 |
| | | | 257/488 |
| 2019/0214490 A1 | 7/2019 | Leendertz et al. | |
| 2022/0013639 A1* | 1/2022 | Tanaka | H01L 29/66068 |

FOREIGN PATENT DOCUMENTS

| DE | 10123818 A1 | 9/2002 |
| DE | 102010039258 A1 | 2/2012 |
| DE | 102011052731 A1 | 3/2012 |
| DE | 112004003046 B4 | 12/2016 |
| DE | 102017221950 A1 | 6/2018 |

* cited by examiner

Primary Examiner — Alexander G Ghyka
(74) Attorney, Agent, or Firm — Murphy, Bilak & Homiller, PLLC

(57) ABSTRACT

A power semiconductor device includes an active region with power cells, each configured to conduct a load current portion between first and second load terminals. Each power cell includes: trenches and mesas laterally confined by the trenches and in a vertical direction adjoining a drift region. The mesas include an active mesa having a source region of a first conductivity type and a body region of a second conductivity type separating the source region from the drift region. Both the source and body region are electrically connected to the first load terminal. At least one trench adjacent to the active mesa is configured to induce a conductive channel in the active mesa. A punch through structure s electrically separated from the active mesa by at least one separation stack.

40 Claims, 8 Drawing Sheets

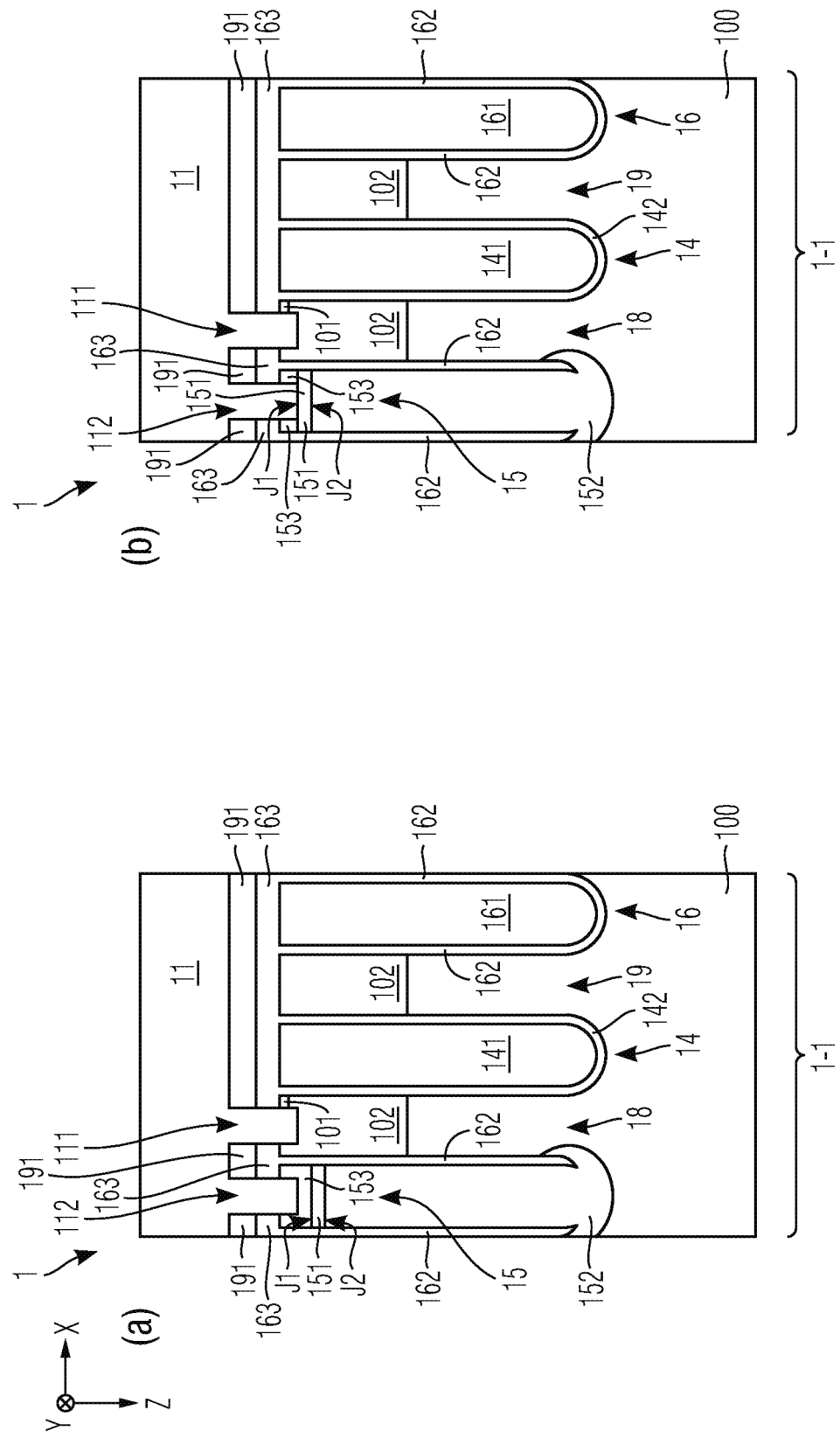

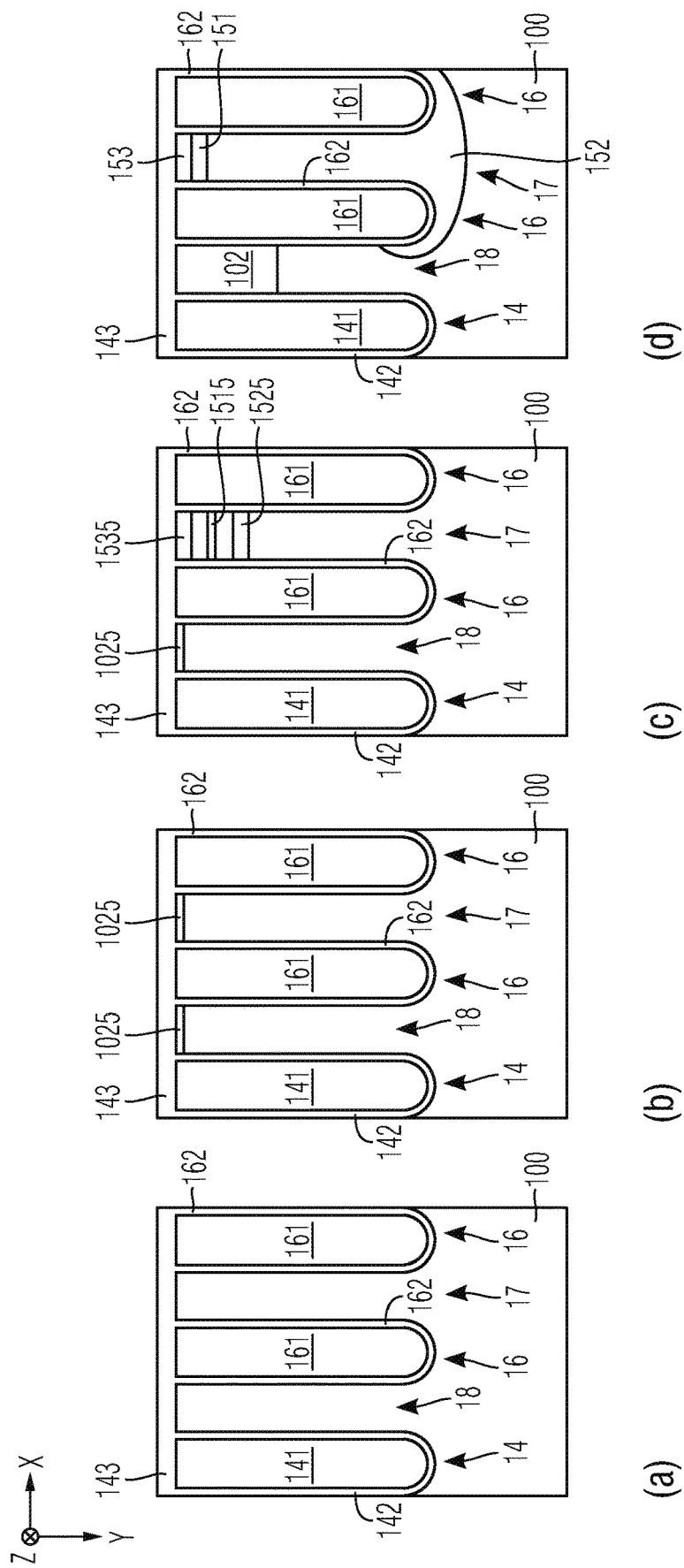

POWER SEMICONDUCTOR DEVICE AND METHOD OF PRODUCING A POWER SEMICONDUCTOR DEVICE

TECHNICAL FIELD

This specification refers to embodiments of a power semiconductor device and to embodiments of a method of producing a power semiconductor device. In particular, this specification refers to a power semiconductor device with an improved saturation current, Isat, limiting concept and related methods.

BACKGROUND

Many functions of modern devices in automotive, consumer and industrial applications, such as converting electrical energy and driving an electric motor or an electric machine, rely on power semiconductor switches. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a forward load current along a load current path between two load terminals of the device.

Further, in case of a controllable power semiconductor device, e.g., a transistor, the load current path may be controlled by means of an insulated electrode, commonly referred to as gate electrode. For example, upon receiving a corresponding control signal from, e.g., a driver unit, the control electrode may set the power semiconductor device in one of a forward conducting state and a blocking state.

The load current is typically conducted by means of an active region of the power semiconductor device. The active region is typically surrounded by an edge termination region, which is terminated by an edge of the chip.

It is a typical design goal to configure a power semiconductor device with high performance, e.g., high load current capability and short circuit robustness.

SUMMARY

According to an embodiment, a power semiconductor device comprises an active region with a plurality of power cells, each configured to conduct a load current portion between a first load terminal and a second load terminal. Each power cell comprises: a plurality of trenches and a number of mesas laterally confined by the trenches and in a vertical direction adjoining a drift region of the power semiconductor device. The number of mesas comprise an active mesa having a source region of a first conductivity type and a body region of a second conductivity type separating the source region from the drift region, wherein both the source region and the body region are electrically connected to the first load terminal, and wherein at least one of the trenches adjacent to the active mesa is configured for inducing a conductive channel in the active mesa, e.g., an inversion channel in the body region. Each power cell further comprises, electrically separated from the active mesa by at least one separation stack, a punch through, PT, structure having: a first region of the first conductivity type arranged between a first junction and a second junction; a second region of the second conductivity type arranged between the second junction and the active mesa. The first junction is either a pn-junction between the first region and a third region of the second conductivity type, the third region connecting the first junction to the first load terminal; or first junction is a Schottky contact between the first load terminal and the first region. The second junction is a pn-junction between the first region and the second region, wherein the second junction is connected to the active mesa through the second region.

According to a further embodiment, a power semiconductor device comprises an active region with a plurality of power cells, each configured to conduct a load current portion between a first load terminal and a second load terminal. Each power cell comprises: a plurality of trenches and a number of mesas laterally confined by the trenches and in a vertical direction adjoining a drift region of the power semiconductor device. The number of mesas comprise an active mesa having a source region of a first conductivity type and a body region, and wherein at least one of the trenches adjacent to the active mesa is configured for inducing an conductive channel in the active mesa, e.g., an inversion channel in the body region. Each power cell further comprises, electrically separated from the active mesa by at least one separation stack, a punch through, PT, structure having: a first region of the first conductivity type arranged between a first junction and a second junction; a second region of the second conductivity type arranged between the second junction and the active mesa. The first junction is either a pn-junction between the first region and a third region of the second conductivity type, the third region connecting the first junction to the first load terminal; or first junction is a Schottky contact between the first load terminal and the first region. The second junction is a pn-junction between the first region and the second region, wherein the second junction is connected to the active mesa through the second region.

According to a yet further embodiment, a power semiconductor device comprises an active region with a plurality of power cells, each configured to conduct a load current portion between a first load terminal and a second load terminal. Each power cell comprises: a plurality of trenches and a number of mesas laterally confined by the trenches and in a vertical direction adjoining a drift region of the power semiconductor device. The number of mesas comprise an active mesa having a source region of a first conductivity type and a body region, and wherein at least one of the plurality of trenches adjacent to the active mesa is configured as control trench, wherein the control trench is connected to a control terminal of the power semiconductor device and configured for inducing a conductive channel in the active mesa, e.g., an inversion channel, in the body region. The power semiconductor device further comprises, electrically separated from the active mesa by at least one separation stack, a punch through, PT, structure having: a first region of the first conductivity type arranged between a first junction and a second junction; a second region of the second conductivity type arranged between the second junction and the active mesa. The first junction is either a pn-junction between the first region and a third region of the second conductivity type, the third region connecting the first junction to the control terminal; or first junction is a Schottky contact between the control terminal and the first region. The second junction is a pn-junction between the first region and the second region, wherein the second junction is connected to the active mesa through the second region.

According to an embodiment, a method of producing a power semiconductor device comprises forming an active region with a plurality of power cells, each configured to conduct a load current portion between a first load terminal and a second load terminal. The method is carried out such that: Each power cell comprises: a plurality of trenches and a number of mesas laterally confined by the trenches and in a vertical direction adjoining a drift region of the power semiconductor device. The number of mesas comprise an active mesa having a source region of a first conductivity type and a body region of a second conductivity type separating the source region from the drift region, wherein both the source region and the body region are electrically connected to the first load terminal, and wherein at least one of the trenches adjacent to the active mesa is configured for inducing a conductive channel in the active mesa, e.g., an inversion channel in the body region. Each power cell further comprises, electrically separated from the active mesa by at least one separation stack, a punch through, PT, structure having: a first region of the first conductivity type arranged between a first junction and a second junction; a second region of the second conductivity type arranged between the second junction and the active mesa. The first junction is either a pn-junction between the first region and a third region of the second conductivity type, the third region connecting the first junction to the first load terminal; or first junction is a Schottky contact between the first load terminal and the first region. The second junction is a pn-junction between the first region and the second region, wherein the second junction is connected to the active mesa through the second region.

According to a further embodiment, a method of producing a power semiconductor device comprises forming an active region with a plurality of power cells, each configured to conduct a load current portion between a first load terminal and a second load terminal. The method is carried out such that: Each power cell comprises: a plurality of trenches and a number of mesas laterally confined by the trenches and in a vertical direction adjoining a drift region of the power semiconductor device. The number of mesas comprise an active mesa having a source region of a first conductivity type and a body region, and wherein the trench adjacent to the active mesa is configured for inducing a conductive channel in the active mesa, e.g., an inversion channel in the body region. Each power cell further comprises, electrically separated from the active mesa by at least one separation stack, a punch through, PT, structure having: a first region of the first conductivity type arranged between a first junction and a second junction; a second region of the second conductivity type arranged between the second junction and the active mesa. The first junction is either a pn-junction between the first region and a third region of the second conductivity type, the third region connecting the first junction to the first load terminal; or first junction is a Schottky contact between the first load terminal and the first region. The second junction is a pn-junction between the first region and the second region, wherein the second junction is connected to the active mesa through the second region.

According to a further embodiment, a method of producing a power semiconductor device comprises forming an active region with a plurality of power cells, each configured to conduct a load current portion between a first load terminal and a second load terminal. The method is carried out such that: Each power cell comprises: a plurality of trenches and a number of mesas laterally confined by the trenches and in a vertical direction adjoining a drift region of the power semiconductor device. The number of mesas comprise an active mesa having a source region of a first conductivity type and a body region, and wherein at least one of the plurality of trenches adjacent to the active mesa is configured as control trench, wherein the control trench is connected to a control terminal of the power semiconductor device and configured for inducing a conductive channel in the active mesa, e.g., an inversion channel, in the body region. Each power cell further comprises, electrically separated from the active mesa by at least one separation stack, a punch through, PT, structure having: a first region of the first conductivity type arranged between a first junction and a second junction; a second region of the second conductivity type arranged between the second junction and the active mesa. The first junction is either a pn-junction between the first region and a third region of the second conductivity type, the third region connecting the first junction to the control terminal; or first junction is a Schottky contact between the control terminal and the first region. The second junction is a pn-junction between the first region and the second region, wherein the second junction is connected to the active mesa through the second region.

The at least one separation stack may comprise at least one pn-junction to electrically separate the punch through structure and/or the control trench from the active mesa. Alternatively or additionally, the at least one separation stack may comprise at least one trench insulator to electrically separate the control trench and the active mesa from each other. For example, the at least one separation stack may be designed as at least one trench insulator.

Furthermore, regarding all embodiments, the second region of the second conductivity type may be arranged between the second junction and the drift region. That is, the second region may be arranged between the second junction on one side and, on another side, the active mesa and/or the drift region. For example, the second junction can be coupled to the active mesa/and or the drift region through the second region.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures, like reference numerals designate corresponding parts. In the drawings.

DETAILED DESCRIPTION

Figure 1:
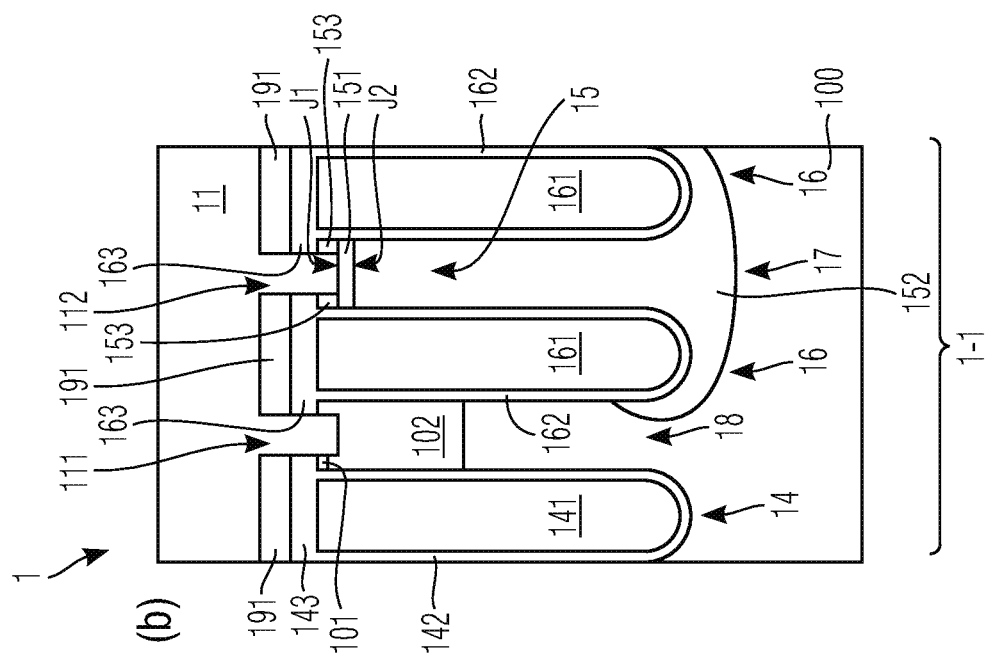
FIG. 1 schematically and exemplarily illustrates a section of a vertical cross-section of a power semiconductor device in accordance with one or more embodiments.
Figure 1:
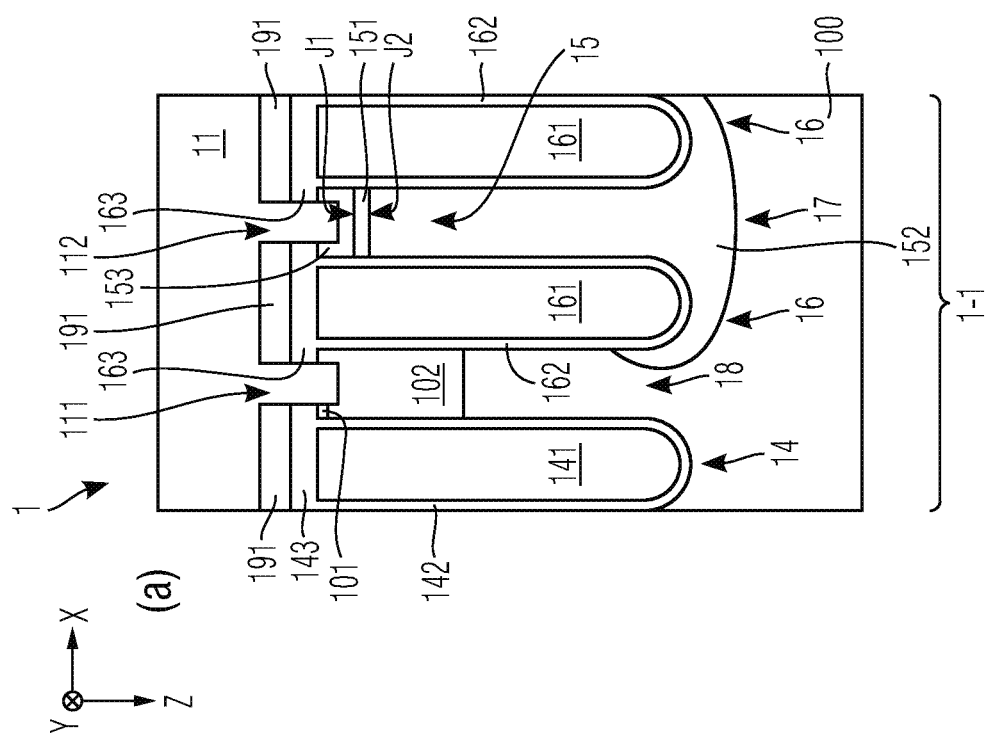

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y. The extension direction Z is also referred to as "vertical direction Z" herein.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device, wherein "low ohmic" may mean that the characteristics of the respective contact are essentially not influenced by the ohmic resistance. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled and/or electrostatically coupled (for example, in case of a junction). To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device, e.g., a power semiconductor device that may be used within a power converter or a power supply. Thus, in an embodiment, such device can be configured to carry a load current that is to be fed to a load and/or, respectively, that is provided by a power source. For example, the power semiconductor device may comprise one or more active power semiconductor unit cells, such as a monolithically integrated diode cell, a derivative of a monolithically integrated diode cell (e.g., a monolithically integrated cell of two anti-serially connected diodes), a monolithically integrated transistor cell, e.g., a monolithically integrated MOSFET or IGBT cell and/or derivatives thereof. Such diode/transistor cells may be integrated in a power semiconductor module. A plurality of such cells may constitute a cell field that is arranged with an active region of the power semiconductor device.

The term "blocking state" of the power semiconductor device may refer to conditions, when the semiconductor device is in a state configured for blocking a current flow through the semiconductor device, while an external voltage is applied. More particularly, the semiconductor device may be configured for blocking a forward current through the semiconductor device while a forward voltage bias is applied. In comparison, the semiconductor may be configured for conducting a forward current in a "conducting state" of the semiconductor device, when a forward voltage bias is applied. A transition between the blocking state and the conducting state may be controlled by a control electrode or, more particularly, a potential of the control electrode. Said electrical characteristics may, of course, only apply within a predetermined working range of the external voltage and the current density within the device. The term "forward biased blocking state" therefore may refer to conditions with the semiconductor device being in the blocking state while a forward voltage bias is applied.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above, e.g., up to at least 400 V or even more, e.g., up to at least 3 kV, or even up to 10 kV or more, depending on the respective application.

For example, the term "power semiconductor device" as used in this specification is not directed to logic semiconductor devices that are used for, e.g., storing data, computing data and/or other types of semiconductor based data processing.

The present specification in particular relates to a power semiconductor device embodied as a diode, a MOSFET or IGBT, i.e., a unipolar or bipolar power semiconductor transistor or diode or a derivate thereof.

For example, the power semiconductor device described below may be a single semiconductor chip, e.g., exhibiting a stripe cell configuration (or a cellular/needle cell configuration) and can be configured to be employed as a power component in a low-, medium- and/or high voltage application.

Referring to FIG. 1, variant (a), according to an embodiment, a power semiconductor device 1 comprises an active region with a plurality of power cells 1-1. One of these power cells 1-1 is illustrated in FIG. 1. The active region which includes the power cells 1-1 can be surrounded by an edge termination region (not illustrated), wherein the configuration of the edge termination region is not the focus of the present specification.

Each power cell 1-1 is configured to conduct a load current portion between a first load terminal 11 and a second load terminal. The second load terminal is not illustrated. For example, the second load terminal may be arranged at the same side of the device 1 as the first load terminal 11, or at an opposite side (e.g., a backside of the device 1), e.g., below drift region 100.

Each power cell 1-1 comprises a plurality of trenches 14, 16 and a number of mesas 17, 18 laterally confined by the trenches 14, 16 and in the vertical direction Z adjoining the drift region 100 of the power semiconductor device 1.

FIG. 1 illustrates, in both variants (a) and (b) an exemplary configuration with three trenches 14, 16 of two trench types that laterally confine two mesas. For example, at least one of said trenches is a control trench 14 configured for controlling the power cell 1-1. The other trenches in the power cell 1-1 may also be control trenches 14 or trenches of a different type, e.g., source trenches 16 whose trench electrodes 161 are electrically connected to the potential of the first load terminal 11, or floating trenches whose trench electrodes are electrically floating or second type control trenches whose trench electrodes are electrically connected to another control potential as compared to the trench electrodes 141 of the control trenches 14.

The trench electrodes 141, 161 are insulated from the semiconductor body of the device 1, e.g., from the drift region 100, based on respective trench insulators 142, 162, 143, 163.

The number of mesas 17, 18 comprise an active mesa 18 having a source region 101 of a first conductivity type and a body region 102 of a second conductivity type. For example, the body region 102 separates the source region 101 from the drift region 100. Both the source region 101 and the body region 102 can be electrically connected to the first load terminal 11. For example, a first contact plug 111 extends from the first load terminal 11 to or into the active mesa 18 for contacting the source region 101 and the body region 102. A trench adjacent to the active mesa 18, which can be called control trench 14, can be configured for inducing an inversion channel in the body region 102, e.g., upon receiving a corresponding control signal. The control trench 14, more specifically, its trench electrode 141, can be connected to a control terminal (not illustrated) of the power semiconductor device 1, e.g., to a so-called gate terminal. For example, depending on the potential of the control terminal and, accordingly, the potential of the control trench electrode 141, the device 1 may be controlled, e.g., turned-on (i.e., set into a conducting state where a forward load current may flow between the first load terminal 11 and the second load terminal, and turned-off (i.e., set into a blocking state where flow of the forward load current is inhibited, even if the voltage between the second load terminal (typically the high side) and the first load terminal 11 (typically the low/ground side) is greater than the turn-on voltage of the device 1), i.e., even if the device 1 is forward biased.

The number of mesas may also comprise one or more mesas 17 different from the active mesa 18, which will be described further below.

Each power cell 1-1 further comprises, electrically separated from the active mesa 18, e.g., by at least one of the trench insulators 142, 162, a punch through, PT, structure 15.

The PT structure has a first region 151 of the first conductivity type arranged between a first junction J1 and a second junction J2. Further, the PT structure 15 has a second region 152 of the second conductivity type arranged between the second junction J2 and the active mesa 18. This general configuration of the PT structure is illustrated in each of FIG. 1 (variants (a) and (b)), FIG. 2 (variants (a) and (b)), FIG. 4 and FIG. 5. For example, both the first region 151 and the second region 152 may be doped semiconductor regions.

Various implementations of such general configuration of the PT structure 15 are possible, which will now be described:

For example, the first junction J1 is a pn-junction between the first region 151 and a third region 153 of the second conductivity type, wherein the third region 153 connects the first junction J1 to the first load terminal 11. This implementation is illustrated in variant (a) of FIG. 1 and variants (a) and (c) of FIG. 2. Also the third region 153 may hence be a doped semiconductor region. For example, the first region 151 may spatially separate the second region 152 and the third region 153 from each other.

In another embodiment, the first junction J1 is a Schottky contact between the first load terminal 11 and the first region 151. This implementation is illustrated in variants (b) of FIGS. 1 and 2; then, the third region 153 may also be omitted or implemented differently.

Furthermore, the PT structure's second junction J2 can be a pn-junction between the first region 151 and the second region 152, wherein the second junction J2 is connected to the active mesa 18 through the second region 152. This aspect of a possible implementation of the PT structure is illustrated in both variants (a) and (b) of FIGS. 1 and 2.

Further implementation variants may be constituted by the location of the PT structure. For example, in accordance with the embodiment illustrated in FIG. 1 (both variants (a) and (b)), the PT structure 15 is arranged in an auxiliary mesa 17 laterally confined by two of the plurality of trenches 14, 16. That is, said number of mesas of the power cell 1-1 may include one (or more) auxiliary mesas 17, wherein at least one of the auxiliary mesas 17 comprises the PT structure 15. The auxiliary mesa 17 may exhibit the same dimensions (e.g., mesa width in the first lateral direction X) as the active mesa 18 or, respectively, designed with a wider or narrower mesa width to accommodate the PT structure 15. The third region 153 may be electrically connected to the first load terminal 11, e.g., based on a second contact plug 112. For example, the auxiliary mesa 17 is laterally confined by two source trenches 16. For example, the PT structures illustrated in FIG. 1 are formed in monocrystalline silicon, Si.

The mesa comprising the PT structure 15 may be the next mesa to the active mesa 18 or might be a mesa further away from the active mesa 18.

Figure 2:
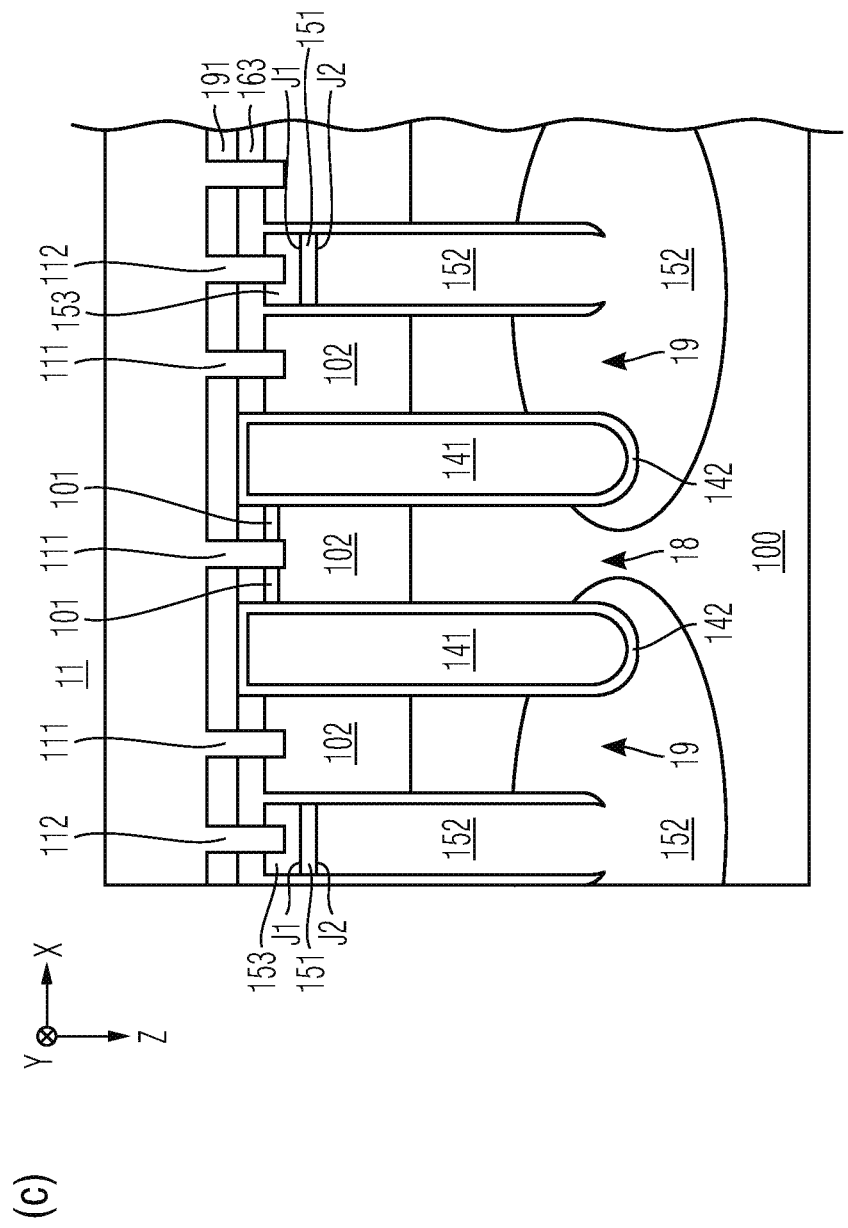
FIG. 2 schematically and exemplarily illustrates a section of a vertical cross-section of a power semiconductor device in accordance with one or more embodiments.

In another embodiment, as illustrated in FIG. 2 (all variants (a) to (c)), the PT structure 15 is arranged in one of the plurality of trenches 14, 16. The trench(es) comprising the PT structure(s) 15 may be different in depth (i.e., extension along the vertical direction Z) compared to the plurality of other trenches 14, 16. For example, the trench (es) comprising the PT structure(s) 15 may have a smaller or larger depth compared to the plurality of other trenches 14, 16. For example, the PT structure 15 is arranged in a trench next to a third type mesa 19, the third type mesa 19 being arranged between the PT structure 15 and the active mesa 18. In FIG. 2, variant (c), the active mesa 18 is arranged between two third type mesas 19. A PT structure 15 may be arranged next to each of the two third type mesas 19 neighboring the active mesa 18. For example, the second regions 152 of the PT structures 15 adjacent to the third type mesas 19 laterally overlap, as illustrated, with the third type mesas 19 and, as illustrated, partially, also with the active mesa 18. The third type mesas 19 may either be contacted to the first load terminal 11, as shown in FIG. 2, variant (c), or be separated from the first load terminal 11, as shown in FIG. 2 variant (a) and (b).

There, the trench bottom may be recessed to allow the second region 152 to extend below the trench and, optionally, towards the active mesa 18. Further, the remaining trench insulators 162 at the trench sidewalls laterally confine the trench interior, i.e. the PT structure 15, e.g., by separating the same from adjacent mesas. For example, the trench that houses the PT structure 15 does not include a trench electrode similar to those electrodes 141, 161 included in the control trenches and source trenches 14, 16. The trench that houses the PT structure 15 may exhibit the same dimensions (e.g., trench width in the first lateral direction X) as, e.g., the control trench 14. In another embodiment, the trench may exhibit a greater or smaller width to facilitate accommodating the PT structure 15. E.g., the PT structures 15 illustrated in FIG. 2 are formed in monocrystalline Si or in polycrystalline Si. To this end, vapor phase epitaxy or solid phase epitaxy processing steps may be applied.

Figure 3:
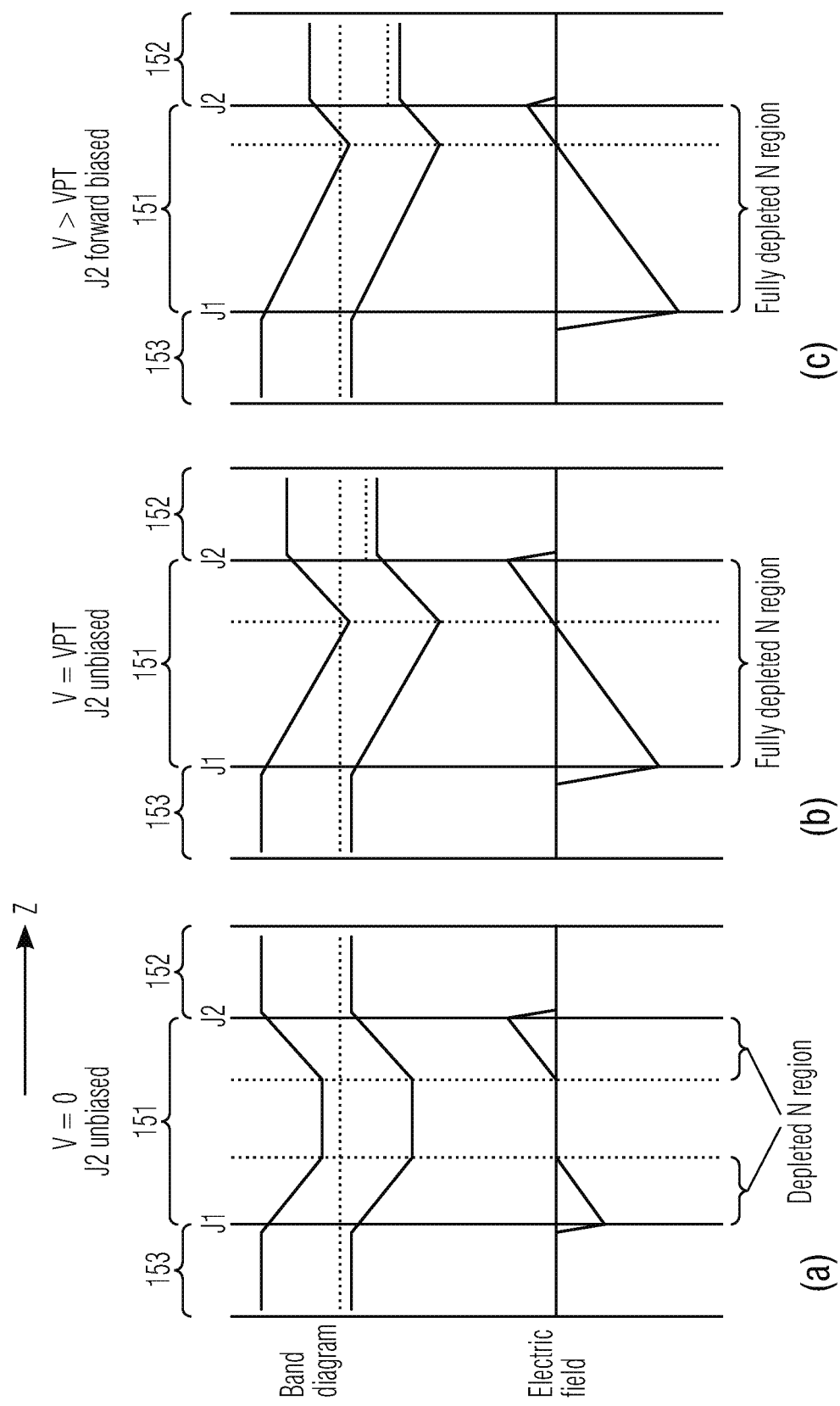
FIG. 3 illustrates exemplary courses of the electric field and energy band diagrams for different voltages in accordance with some embodiments.

Referring to both FIG. 1 and FIG. 2, the PT structure 15 may be configured to allow for a current flow that has a unipolar portion amounting to at least 85% or to at least 99% of the total of the current flow in the PT structure 15. For example, this may be ensured by corresponding dopant concentrations in the first region 151, the second region 152 and (if implemented) in the third region 153. For example, referring to FIG. 3, for a given dopant concentration level of the first region 151 (in FIG. 3 also referred to as "N region"), the vertical extension of the first region 151 and/or the vertical extension and the dopant concentration of the second region 152 is/are chosen so that the first region 151 (N region) becomes fully depleted, e.g., at a low voltage difference across the PT structure 15. That is, the space charge region of reverse biased junction J1 reaches the space charge region of the forward biased junction J2 at a desired punch through voltage, VPT. The PT structure 15 is then configured to extract holes without injecting electrons suppressed by the thicker second region 152 (e.g., a highly doped p-region), e.g., if the voltage at an imaginary electrode at the bottom of the PT structure 15 reaches the VPT. In another example, the third region 153 at the junction J1 may be chosen thin enough or having a lower dopant concentration level or both so that it is completely depleted when the PT structure 15 is unbiased or at another bias, for example at VPT/2.

Generally, the PT structure 15 can be laterally confined by two source trenches 16 whose trench electrodes 161 are electrically connected to the first load terminal 11. In another embodiment, the PT structure 15 can be laterally confined by one source trench 16 whose trench electrode 161 is electrically connected to the first load terminal 11 and by one control trench 14 whose trench electrode 141 is electrically connected to the control terminal.

The power semiconductor device 1 (herein also referred to as device 1) may be a bipolar semiconductor device, e.g., an IGBT (wherein the IGBT can be, without being limited thereto, an npnp IGBT with an n-inversion channel or a pnpn IGBT with an p-inversion channel) or an RC IGBT. Thus, the drift region 100 may be of the first conductivity type and for example extend along the vertical direction Z until adjoining, either directly or via a field stop layer, a collector region (not illustrated) of the second conductivity type, wherein said collector region can be electrically connected to the second load terminal. If configured, for example, as an RC IGBT, the device 1 may further comprise one or more second collector region (not illustrated) of the first conductivity type, wherein said second emitter region(s) can be electrically connected to the second load terminal.

In an embodiment, as illustrated in both FIG. 1 and FIG. 2, the second region 152 entirely separates the remaining portions of the PT structure 15 above thereof (with respect to the vertical direction Z) from the drift region 100. For example, the third region 153, the first junction J1, the first region 151 and the second junction J2 are arranged in proximity of a surface of the semiconductor body of the device 1, and do not directly adjoin the drift region 100; rather, between said components of the PT structure 15 and the drift region, there is arranged the second region 152.

In an embodiment, still referring to FIGS. 1 and 2, the second region 152 may extend further along the vertical direction Z than the bottom of the trench 14 that laterally confines the active mesa 18, e.g., so as to laterally overlap with the active mesa 18.

For example, the second region 152 forms a portion of a Junction Field Effect Transistor, JFET, structure. For example, FIG. 2, variant (c) shows a mirror symmetry along the active mesa 18 in the vertical direction Z such that the PT structures 15 are located close to both sides of the active mesa 18. For example, the second regions 152 extend laterally from both sides towards the active mesa 18, thereby forming a JFET with two junctions.

Furthermore, the second region 152 can have, at the vertical level corresponding to the bottom of the trench that laterally confines the PT structure 15 (which can be either a mesa (cf. FIG. 1) or a trench that houses the PT structure 15 (cf. FIG. 2)), a dopant concentration of at least $1*10^{19}$ cm$^{-3}$, or of at least $1*10^{18}$ cm$^{-3}$, or of even more than $1*10^{20}$ cm$^{3}$. Said dopant concentration of the second region 152 may be present within 90% of the vertical extension of the second region 152 between the second junction J2 and the bottom of the trench 16 adjacent to the second region 152.

The PT structure 15 can have said punch trough voltage, i.e., threshold voltage, VPT, within the range of 0.5 V to 3 V, or within the range of 0.6 to 2 V, or within the range of 0.7 V to 1.5 V.

In a different embodiment, according to which first junction J1 is either a pn-junction between the first region 151 and the third region 153 of the second conductivity type (the third region 153 connecting the first junction J1 to the control terminal) or according to which the first junction J1 is a Schottky contact between the control terminal and the first region 151, VPT can be larger, i.e., within the range of 110% and 200% of an operating voltage of the control terminal. The operating voltage is typically applied as a voltage between the control terminal and the first load terminal 11, wherein the first load terminal 11 may be connected to ground/earth, e.g., exhibits a potential of 0 V.

That is, if the relevant voltage applied to the PT structure 15 exceeds this threshold voltage, the PT structure becomes conductive and allows for said unipolar current flow. For example, during a short circuit event, the power semiconductor device 1 is configured to clamp, the on-state voltage of the active mesa 18 to the threshold voltage of the PT structure 15. For example, during the short circuit event, the (forward) load current exceeds the nominal load current for which the device 1 has been designed. To limit power losses in the device 1, and hence to avoid overheating of the device 1, the on-state voltage of the active mesa 18 is clamped to (and in particular does not exceed) the threshold voltage of the PT structure 15.

In an embodiment, the PT structure 15 is configured to not reduce the carrier confinement or, respectively, the stored charge in the drift region 100 under normal forward operation (on-state) of the power semiconductor device 1 by more than 10%.

In view of the aforesaid, the PT structure 15 may exhibit one of many possible configurations that allow fulfilling its function. For example, the PT structure is one of the following: a p-n-p structure (where, e.g., the first, second and third regions are each semiconductor regions), a Schottky Metal-n-p structure, an n-p-n structure, Schottky Metal-p-n structure, a Schottky Metal-p-n-p structure, or Schottky Metal-n-p-n structure.

Still referring to both FIG. 1 and FIG. 2, the first region 151 can have a total vertical extension of less than 1 μm, of less than 0.5 μm or of less than 0.3 μm Further, the first region 151 can has a dopant concentration of less than $1*10^{19}$ cm$^{-3}$, of less than $1*10^{18}$ cm$^3$ or the dopant concentration times the vertical extension of the first region 151 squared can be less than $1*10^{18}$ cm$^3$ μm$^2$ Also, the first region 151 can be arranged at a vertical level within the range of the vertical extension of the body region 102.

Further, if provided, the third region 153 of the second conductivity type can be arranged between the first junction J1 and the first load terminal 11. Depending on the configuration of the PT structure 15, the second contact plug 112 may either penetrate the third region 153 (cf. FIG. 1(b) and FIG. 2(b)) to directly adjoin the first region 151 and form the first junction J1, e.g., in case of a Schottky Metal-n-p structure (in which case the third region 153 may also be omitted), or, the second contact plug 112 may adjoin the third region 153 and terminate there (cf. FIG. 1(a) and FIG. 2(a)).

As described above, the second region 152 of the second conductivity type is arranged between the second junction J2 and the active mesa 18. For example, a lateral distance between the active mesa 18 and the PT structure 15 including said second region 152 is smaller than five times the width of the active mesa 18 or even smaller than twice the width of the active mesa 18. Said lateral distance between the active mesa 18 and the PT structure 15 may even be zero or at least close to zero. In some embodiments, the active mesa 18 and the PT structure 15 are laterally overlapping. Said lateral distance may be the lateral distance between the active mesa 18 and the trench/mesa containing the PT structure 15.

In an embodiment, the PT structure 15 has a vertical layer stack configuration formed at least based by the first junction J1, the first region 151 below thereof, the second junction J2 below thereof and the second region 152 below thereof. For example, the PT structure 15 and the active mesa 18 exhibit a common vertical extension range. For example, the PT structure 15 may entirely vertically overlap with the active mesa 18.

Besides the active mesa 18 and the auxiliary mesa 17, the power cell 1-1 may include, cf. FIG. 2, one or more third type mesas 19, e.g., dummy mesas that are not configured to conduct a load current. For example, in a dummy mesa, there is no conductive path along the vertical direction between the first load terminal 11 and the semiconductor portion of the dummy mesa. Furthermore, there can be third type mesas 19 in which no conductive channel can be induced due to a missing source region 101. The third type mesas 19 may be contacted to the first load terminal 11 or be separated from the first load terminal 11.

The trenches 14, 16 may further be separated from the first load terminal based on insulation layer 191, cf. both FIG. 1 and FIG. 2.

Presented herein are also methods of forming a power semiconductor device.

According to an embodiment, a method of producing a power semiconductor device comprises forming an active region with a plurality of power cells, each configured to conduct a load current portion between a first load terminal and a second load terminal. The method is carried out such that: Each power cell comprises: a plurality of trenches and a number of mesas laterally confined by the trenches and in a vertical direction adjoining a drift region of the power semiconductor device. The number of mesas comprise an active mesa having a source region of a first conductivity type and a body region of a second conductivity type separating the source region from the drift region, wherein both the source region and the body region are electrically connected to the first load terminal, and wherein at least one of the trenches adjacent to the active mesa is configured for inducing a conductive channel in the active mesa, e.g., an inversion channel in the body region. Each power cell further comprises, electrically separated from the active mesa by at least one separation stack, a punch through, PT, structure having: a first region of the first conductivity type arranged between a first junction and a second junction; a second region of the second conductivity type arranged between the second junction and the active mesa. The first junction is either a pn-junction between the first region and a third region of the second conductivity type, the third region connecting the first junction to the first load terminal; or first junction is a Schottky contact between the first load terminal and the first region. The second junction is a pn-junction between the first region and the second region, wherein the second junction is connected to the active mesa through the second region.

According to a further embodiment, a method of producing a power semiconductor device comprises forming an active region with a plurality of power cells, each configured to conduct a load current portion between a first load terminal and a second load terminal. The method is carried out such that: Each power cell comprises: a plurality of trenches and a number of mesas laterally confined by the trenches and in a vertical direction adjoining a drift region of the power semiconductor device. The number of mesas comprise an active mesa having a source region of a first conductivity type and a body region, and wherein the trench adjacent to the active mesa is configured for inducing a conductive channel in the active mesa, e.g., an inversion channel in the body region. Each power cell further comprises, electrically separated from the active mesa by at least one separation stack, a punch through, PT, structure having: a first region of the first conductivity type arranged between a first junction and a second junction; a second region of the second conductivity type arranged between the second junction and the active mesa. The first junction is either a pn-junction between the first region and a third region of the second conductivity type, the third region connecting the first junction to the first load terminal; or first junction is a Schottky contact between the first load terminal and the first region. The second junction is a pn-junction between the first region and the second region, wherein the second junction is connected to the active mesa through the second region.

According to a further embodiment, a method of producing a power semiconductor device comprises forming an active region with a plurality of power cells, each configured to conduct a load current portion between a first load terminal and a second load terminal. The method is carried out such that: Each power cell comprises: a plurality of trenches and a number of mesas laterally confined by the trenches and in a vertical direction adjoining a drift region of the power semiconductor device. The number of mesas comprise an active mesa having a source region of a first conductivity type and a body region, and wherein at least one of the plurality of trenches adjacent to the active mesa is configured as control trench, wherein the control trench is connected to a control terminal of the power semiconductor device and configured for inducing a conductive channel in the active mesa, e.g., an inversion channel, in the body region. Each power cell further comprises, electrically separated from the active mesa by at least one separation stack, a punch through, PT, structure having: a first region of the first conductivity type arranged between a first junction and a second junction; a second region of the second conductivity type arranged between the second junction and the active mesa. The first junction is either a pn-junction between the first region and a third region of the second conductivity type, the third region connecting the first junction to the control terminal; or first junction is a Schottky contact between the control terminal and the first region. The second junction is a pn-junction between the first region and the second region, wherein the second junction is connected to the active mesa through the second region.

Further embodiments of the methods correspond to the embodiments of the device 1 described above. In so far, it is referred to the aforesaid.

Two exemplary method embodiments will now be described with respect to FIG. 4 and FIG. 5. The embodiment illustrated in FIG. 4 may be applied to form the embodiment of the device illustrated in FIG. 1(a), and the embodiment illustrated in FIG. 5 may be applied to form the embodiment of the device illustrated in FIG. 1(b).

Figure 4:
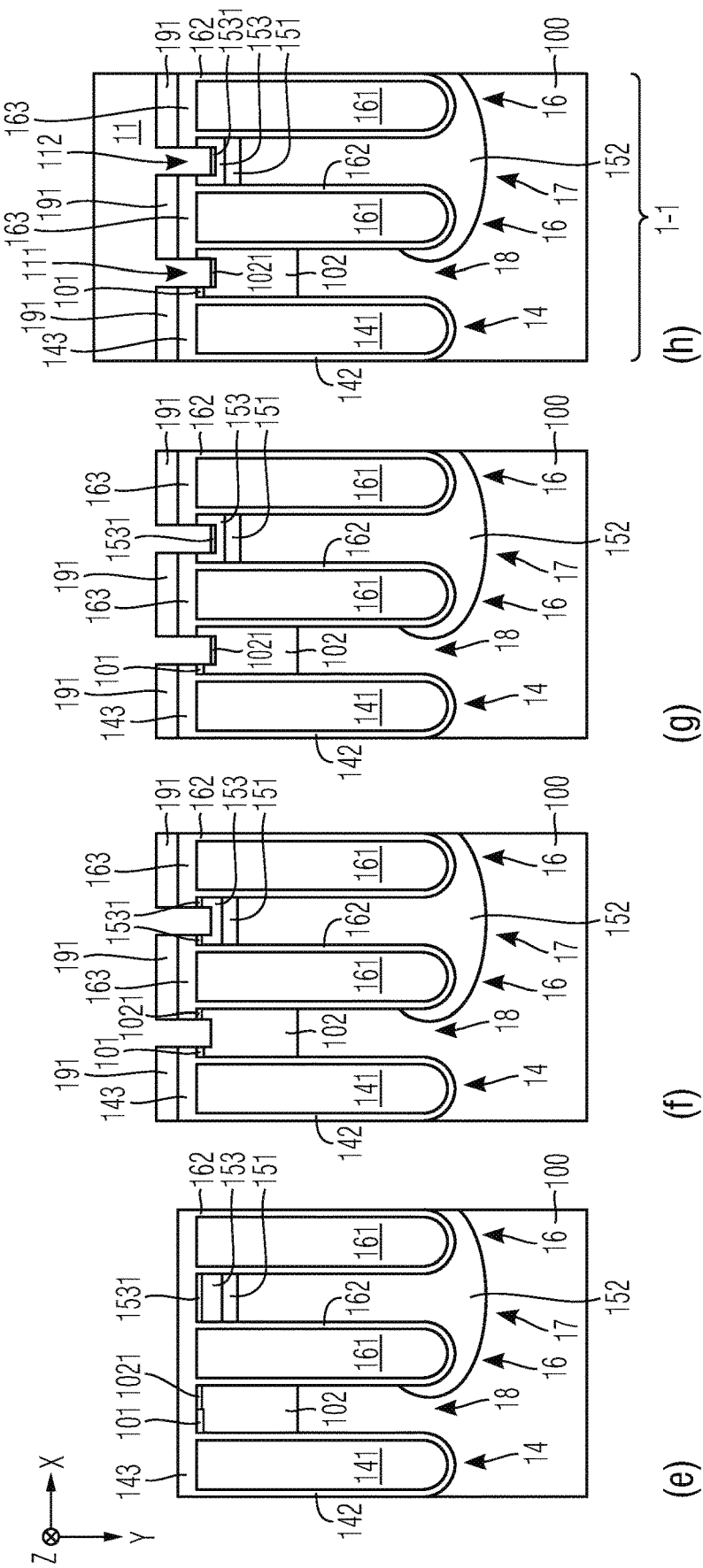
FIG. 4 schematically and exemplarily illustrates, based on sections of a vertical cross-section, a method of producing a power semiconductor device in accordance with one or more embodiments.

Referring first to FIG. 4, stage (a) may include formation of the trench insulator 143, 142, 162, the formation and the planarization of the trench electrodes 141, 161, and the oxidation of the top surface of the trench electrodes 141, 161. Stage (b) may include an implantation processing step to form implanted regions 1025 that later serve as seed region for forming the body region 102. Stage (c) may include masked implantation processing steps to form implanted regions 1535, 1515, 1525 that later serve as seed regions for forming the first region 151, the second region 152 and the third region 153 of the PT structure. Alternatively, implanted region 1535 is formed already within the implantation processing step carried out for the seed region 1025. Stage (d) includes one or more diffusion processing steps to form body region 102 and the first region 151, the second region 152 and the third region 153 of the PT structure. Stage (e) may include further masked implantations processing steps to form the source region 101 and higher doped body contact subregion 1021 and contact subregion 1531 in the third region 153 (these subregions 1021 and 1531 are optional and therefore not illustrated in FIG. 1(a)). Stage (f) may include a deposition processing step to form the insulation layer 191 and groove etch processing steps to form recesses for the first contact plug 111 and the second contact plug 112. A further contact implantation processing step may then be carried out (cf. stage (g)) to ensure reliable electrical connections between the body region 102 and the first contact plug 111, and between the third region 153 and the second contact plug 112. Stage (h) may include all further processing steps necessary for producing the power cell 1-1.

Figure 5:
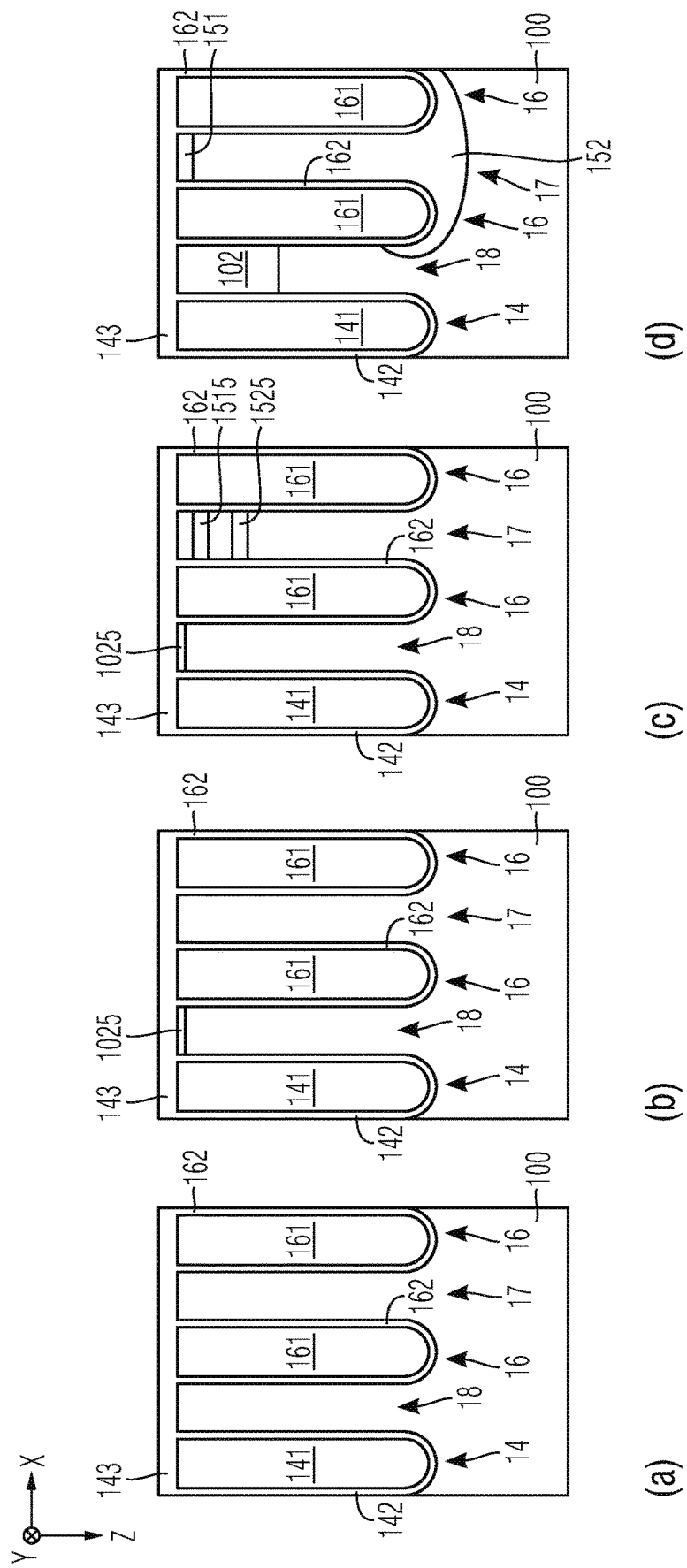
FIG. 5 schematically and exemplarily illustrates, based on sections of a vertical cross-section, a method of producing a power semiconductor device in accordance with one or more embodiments.
Figure 5:
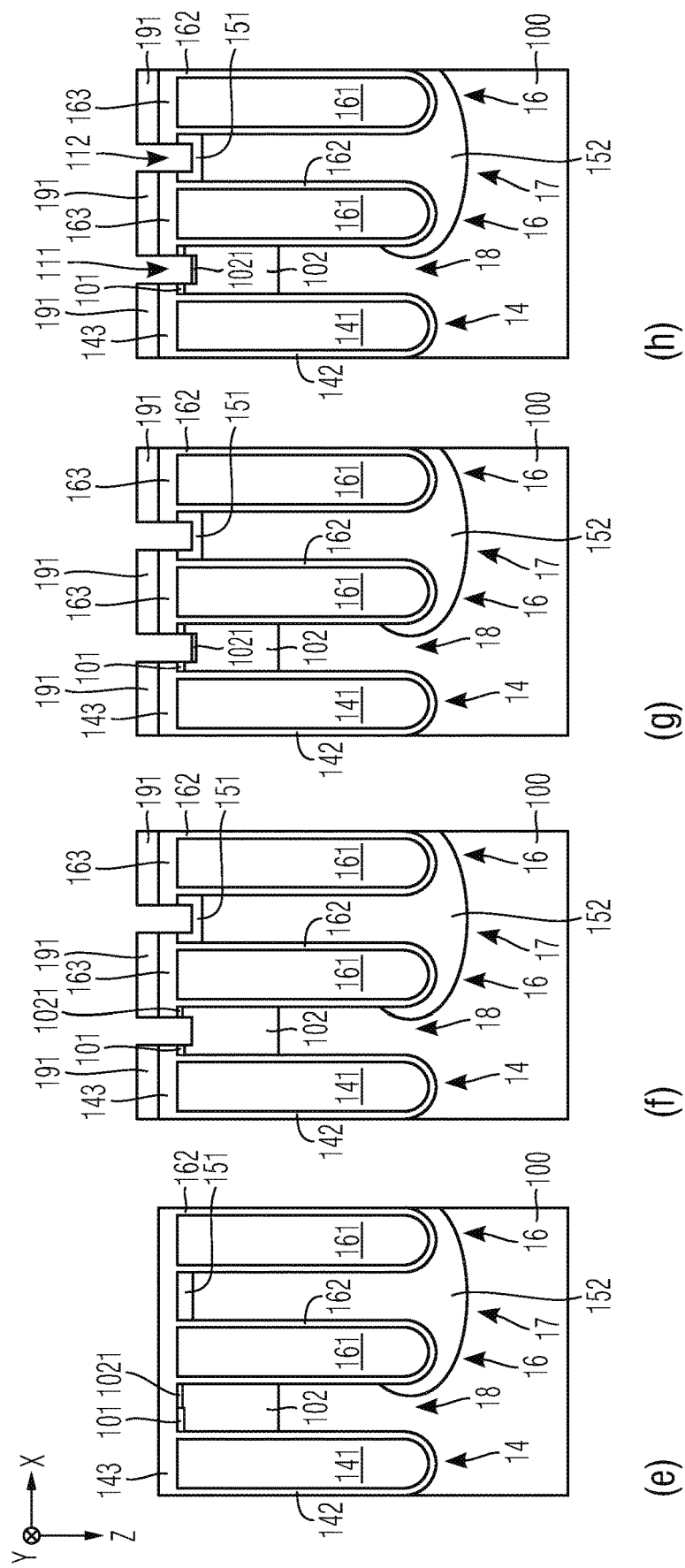

Referring to FIG. 5, stages (a) to (h) may be implemented as described with respect to stages (a) and (h) of FIG. 4, except the processing steps related to the third region 153. For example, the implantation carried out for forming the implanted region 1025 is a masked implantation; only the active mesa 18 is subjected to said implantation and no seed region 1535 is formed in stage (c), and, accordingly, no third region 153 after the diffusion processing step in stage (d). Accordingly, there is also no contact subregion 1531 formed during stage (e).

Further embodiments presented herein may in particular allow designing an IGBT with improved limitation of the saturation current (Isat). The proposed PT structure 15 may for example allow for a tunable hole extraction, e.g., by correspondingly defining its threshold voltage VPT.

In the above, embodiments pertaining to power semiconductor device, such as MOSFETs, IGBTs, RC IGBTs and derivatives thereof, and corresponding processing methods were explained. For example, these power semiconductor devices are based on silicon (Si). Accordingly, a monocrystalline semiconductor region or layer, e.g., the semiconductor body and its regions/zones, e.g., regions etc. can be a monocrystalline Si-region or Si-layer. In other embodiments, polycrystalline or amorphous silicon may be employed.

It should, however, be understood that the semiconductor body and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixCl-x) and silicon-SiGe heterojunction semiconductor materials. For power semiconductor switches applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device comprising an active region with a plurality of power cells, each configured to conduct a load current portion between a first load terminal and a second load terminal, wherein each power cell comprises:
   a plurality of trenches;
   a plurality of mesas laterally confined by the trenches and in a vertical direction adjoining a drift region of the power semiconductor device, wherein the plurality of mesas comprises an active mesa having a source region of a first conductivity type and a body region of a second conductivity type separating the source region from the drift region, wherein both the source region and the body region are electrically connected to the first load terminal, and wherein at least one of the trenches adjacent to the active mesa is configured to induce a conductive channel in the active mesa; and
   a punch through structure electrically separated from the active mesa by at least one separation stack and comprising a first region of the first conductivity type arranged between a first junction and a second junction, and a second region of the second conductivity type arranged between the second junction and the active mesa,
   wherein the first junction is either:
      a pn-junction between the first region and a third region of the second conductivity type, the third region connecting the first junction to the first load terminal; or
      a Schottky contact between the first load terminal and the first region,
   wherein the second junction is a pn-junction between the first region and the second region,
   wherein the second junction is connected to the active mesa through the second region.

2. The power semiconductor device of claim 1, wherein the punch through structure is arranged in at least one auxiliary mesa laterally confined by two of the plurality of trenches.

3. The power semiconductor device of claim 1, wherein the punch through structure is arranged in at least one of the plurality of trenches.

4. The power semiconductor device of claim 1, wherein the punch through structure is configured to allow for a current flow that has a unipolar portion amounting to at least 85% of a total of the current flow in the punch through structure.

5. The power semiconductor device of claim 1, wherein the second region entirely separates the remaining portions of the punch through structure above thereof from the drift region, and/or wherein the second region is spatially separated from the third region at least based on the first region.

6. The power semiconductor device of claim 1, wherein the second region extends further along the vertical direction than a bottom of the trench that laterally confines the active mesa.

7. The power semiconductor device of claim 1, wherein the second region extends, below the at least one separation stack, laterally towards the active mesa.

8. The power semiconductor device of claim 1, wherein the second region laterally overlaps with the active mesa.

9. The power semiconductor device of claim 1, wherein the second region forms a portion of a JFET structure.

10. The power semiconductor device of claim 1, wherein the second region has, at the vertical level corresponding to a bottom of the trench that laterally confines the punch through structure, a dopant concentration of at least $1*10^{19}$ $cm^{-3}$.

11. The power semiconductor device of claim 1, wherein the punch through structure has a threshold voltage in a range of 0.5 V to 3 V.

12. The power semiconductor device of claim 1, wherein the power semiconductor device is configured to clamp, during a short circuit event, an on-state voltage of the active mesa to a threshold voltage of the punch through structure.

13. The power semiconductor device of claim 1, wherein the punch through structure is one of a:
   a p-n-p structure;
   a Schottky metal-n-p structure;
   an n-p-n structure;
   a Schottky metal-p-n structure;
   a Schottky metal-p-n-p structure; or
   a Schottky metal-n-p-n structure.

14. The power semiconductor device of claim 1, wherein the first region has a total vertical extension of less than 1 μm, and/or wherein the first region has a dopant concentration of less than $1*10^{19}$ $cm^{-3}$.

15. The power semiconductor device of claim 1, wherein the punch through structure is laterally confined by two trenches having trench electrodes electrically connected to the first load terminal.

16. The power semiconductor device of claim 1, wherein the first region is arranged at a vertical level within a range of a vertical extension of the body region.

17. The power semiconductor device of claim 1, wherein a lateral distance between the active mesa and the punch through structure is smaller than five times a width of the active mesa.

18. The power semiconductor device of claim 1, wherein the punch through structure has a vertical layer stack configuration formed at least based by the first junction, the first region below thereof, the second junction below thereof and the second region below thereof.

19. The power semiconductor device of claim 1, wherein the power semiconductor device is an IGBT or an RC IGBT.

20. A power semiconductor device comprising an active region with a plurality of power cells, each configured to conduct a load current portion between a first load terminal and a second load terminal, wherein each power cell comprises:
- a plurality of trenches;
- a plurality of active mesas laterally confined by the trenches and in a vertical direction adjoining a drift region of the power semiconductor device, wherein the plurality of mesas comprises an active mesa having a source region of a first conductivity type and a body region, and wherein at least one of the trenches adjacent to the active mesa is configured to induce an conductive channel in the active mesa; and
- a punch through structure electrically separated from the active mesa and comprising a first region of the first conductivity type arranged between a first junction and a second junction and a second region of the second conductivity type arranged between the second junction and the active mesa, wherein the first junction is either:
- a pn-junction between the first region and a third region of the second conductivity type, the third region connecting the first junction to the first load terminal; or
- a Schottky contact between the first load terminal and the first region, wherein the second junction is a pn-junction between the first region and the second region, wherein the second junction is connected to the active mesa through the second region.

21. The power semiconductor device of claim 20, wherein the punch through structure is arranged in at least one auxiliary mesa laterally confined by two of the plurality of trenches.

22. The power semiconductor device of claim 20, wherein the punch through structure is arranged in at least one of the plurality of trenches.

23. The power semiconductor device of claim 20, wherein the punch through structure is configured to allow for a current flow that has a unipolar portion amounting to at least 85% of a total of the current flow in the punch through structure.

24. The power semiconductor device of claim 20, wherein the second region entirely separates the remaining portions of the punch through structure above thereof from the drift region, and/or wherein the second region is spatially separated from the third region at least based on the first region.

25. The power semiconductor device of claim 20, wherein the second region extends further along the vertical direction than a bottom of the trench that laterally confines the active mesa.

26. The power semiconductor device of claim 20, wherein the second region extends, below the at least one separation stack, laterally towards the active mesa.

27. The power semiconductor device of claim 20, wherein the second region laterally overlaps with the active mesa.

28. The power semiconductor device of claim 20, wherein the second region forms a portion of a JFET structure.

29. The power semiconductor device of claim 20, wherein the second region has, at the vertical level corresponding to a bottom of the trench that laterally confines the punch through structure, a dopant concentration of at least $1*10^{19}$ $cm^{-3}$.

30. The power semiconductor device of claim 20, wherein the punch through structure has a threshold voltage in a range of 0.5 V to 3 V.

31. The power semiconductor device of claim 20, wherein the power semiconductor device is configured to clamp, during a short circuit event, an on-state voltage of the active mesa to a threshold voltage of the punch through structure.

32. The power semiconductor device of claim 20, wherein the punch through structure is one of a:
- a p-n-p structure;
- a Schottky metal-n-p structure;
- an n-p-n structure;
- a Schottky metal-p-n structure;
- a Schottky metal-p-n-p structure; or
- a Schottky metal-n-p-n structure.

33. The power semiconductor device of claim 20, wherein the first region has a total vertical extension of less than 1 µm, and/or wherein the first region has a dopant concentration of less than $1*10^{19}$ $cm^{-3}$.

34. The power semiconductor device of claim 20, wherein the punch through structure is laterally confined by two trenches having trench electrodes electrically connected to the first load terminal.

35. The power semiconductor device of claim 20, wherein the first region is arranged at a vertical level within a range of a vertical extension of the body region.

36. The power semiconductor device of claim 20, wherein a lateral distance between the active mesa and the punch through structure is smaller than five times a width of the active mesa.

37. The power semiconductor device of claim 20, wherein the punch through structure has a vertical layer stack configuration formed at least based by the first junction, the first region below thereof, the second junction below thereof and the second region below thereof.

38. The power semiconductor device of claim 20, wherein the power semiconductor device is an IGBT or an RC IGBT.

39. A power semiconductor device comprising an active region with a plurality of power cells, each configured to conduct a load current portion between a first load terminal and a second load terminal, wherein each power cell comprises:
- a plurality of trenches;
- a plurality of mesas laterally confined by the trenches and in a vertical direction adjoining a drift region of the power semiconductor device, wherein the plurality of mesas comprises an active mesa having a source region of a first conductivity type and a body region of a second conductivity type separating the source region from the drift region, wherein both the source region and the body region are electrically connected to the first load terminal, and wherein at least one of the plurality of trenches adjacent to the active mesa being configured as a control trench, wherein the control trench is connected to a control terminal of the power semiconductor device and configured to induce an inversion channel in the body region; and
- a punch through structure electrically separated from the active mesa by at least one separation stack and comprising a first region of the first conductivity type arranged between a first junction and a second junction, and a second region of the second conductivity type arranged between the second junction and the active mesa;

wherein the first junction is either:
- a pn-junction between the first region and a third region of the second conductivity type, the third region connecting the first junction to the control terminal; or
- a Schottky contact between the control terminal and the first region, wherein the second junction is a pn-junction between the first region and the second region, wherein the second junction is connected to the active mesa through the second region.

40. The power semiconductor device of claim 39, wherein the punch through structure has a threshold voltage in a range of 110% and 200% of an operating voltage of the control terminal.

\* \* \* \* \*